(12) United States Patent
Pan et al.

(10) Patent No.: US 11,462,481 B2
(45) Date of Patent: Oct. 4, 2022

(54) FAN-OUT PACKAGING STRUCTURE AND METHOD OF MAKING SAME

(71) Applicant: Kore Semiconductor Co., Ltd., Qingdao (CN)

(72) Inventors: Ying-Chieh Pan, New Taipei (TW); Hsiang-Hua Lu, New Taipei (TW); Ching-Yu Ni, New Taipei (TW)

(73) Assignee: Kore Semiconductor Co., Ltd., Qingdao (CN)

( * ) Notice: Subject to any disclaimer, the term of this patent is extended or adjusted under 35 U.S.C. 154(b) by 0 days.

(21) Appl. No.: 16/936,721

(22) Filed: Jul. 23, 2020

(65) Prior Publication Data

US 2021/0134732 A1   May 6, 2021

(30) Foreign Application Priority Data

Nov. 6, 2019   (CN) .......................... 201911078460.5

(51) Int. Cl.
| | | |
|---|---|---|
| *H01L 23/544* | (2006.01) | |
| *H01L 21/56* | (2006.01) | |
| *H01L 23/498* | (2006.01) | |
| *H01L 23/31* | (2006.01) | |
| *H01L 25/065* | (2006.01) | |

(52) U.S. Cl.
CPC .......... *H01L 23/544* (2013.01); *H01L 21/561* (2013.01); *H01L 21/568* (2013.01); *H01L 23/3121* (2013.01); *H01L 23/49811* (2013.01); *H01L 23/49822* (2013.01); *H01L 25/0655* (2013.01); *H01L 2223/54426* (2013.01)

(58) Field of Classification Search
CPC ................. H01L 23/44; H01L 23/3121; H01L 23/49811; H01L 23/49822; H01L 21/561; H01L 21/568; H01L 25/0655; H01L 2223/54426
See application file for complete search history.

(56) References Cited

U.S. PATENT DOCUMENTS

| | | | |
|---|---|---|---|
| 2012/0228754 A1* | 9/2012 | Liu .......................... | A61P 29/00 257/676 |
| 2019/0131253 A1* | 5/2019 | Lee ....................... | H01L 23/3114 |
| 2019/0139890 A1* | 5/2019 | Lu ............................. | H01L 24/19 |
| 2020/0294914 A1* | 9/2020 | Agarwal ............. | H01L 21/6835 |

FOREIGN PATENT DOCUMENTS

| | | |
|---|---|---|
| CN | 103000593 A | 3/2013 |
| CN | 104037134 A | 9/2014 |
| CN | 106098630 A | 11/2016 |
| TW | 256948 B | 9/1995 |
| TW | 201807771 A | 3/2018 |

* cited by examiner

*Primary Examiner* — Timor Karimy
(74) *Attorney, Agent, or Firm* — ScienBiziP, P.C.

(57) ABSTRACT

A fan-out packaging structure includes a redistribution layer and a positioning sheet formed on the redistribution layer. The positioning sheet defines at least one opening penetrating opposite sides of the positioning sheet. At least one chip is mounted in the at least one opening. The redistribution layer comprises at least one conductive circuit. The at least one chip is electrically coupled to a corresponding one conductive circuit.

5 Claims, 9 Drawing Sheets

FAN-OUT PACKAGING STRUCTURE AND METHOD OF MAKING SAME

FIELD

The subject matter herein generally relates to fan-out packaging structures, and more particularly to a method for making a fan-out packaging structure and the fan-out packaging structure made by the method.

BACKGROUND

Generally, a method for manufacturing a fan-out packaging structure includes mounting a chip on a carrier board, forming a packaging layer on the carrier board to cover the chip, and providing wires in the packaging layer. However, the chip in the packaging layer may shift during subsequent processes, which causes poor connection between the chip and the wires in the packaging layer.

BRIEF DESCRIPTION OF THE DRAWINGS

Implementations of the present disclosure will now be described, by way of embodiments, with reference to the attached figures.

DETAILED DESCRIPTION

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "substantially" is defined to be essentially conforming to the particular dimension, shape, or other word that "substantially" modifies, such that the component need not be exact. For example, "substantially cylindrical" means that the object resembles a cylinder, but can have one or more deviations from a true cylinder. The term "comprising" means "including, but not necessarily limited to"; it specifically indicates open-ended inclusion or membership in a so-described combination, group, series and the like.

Figure 1:
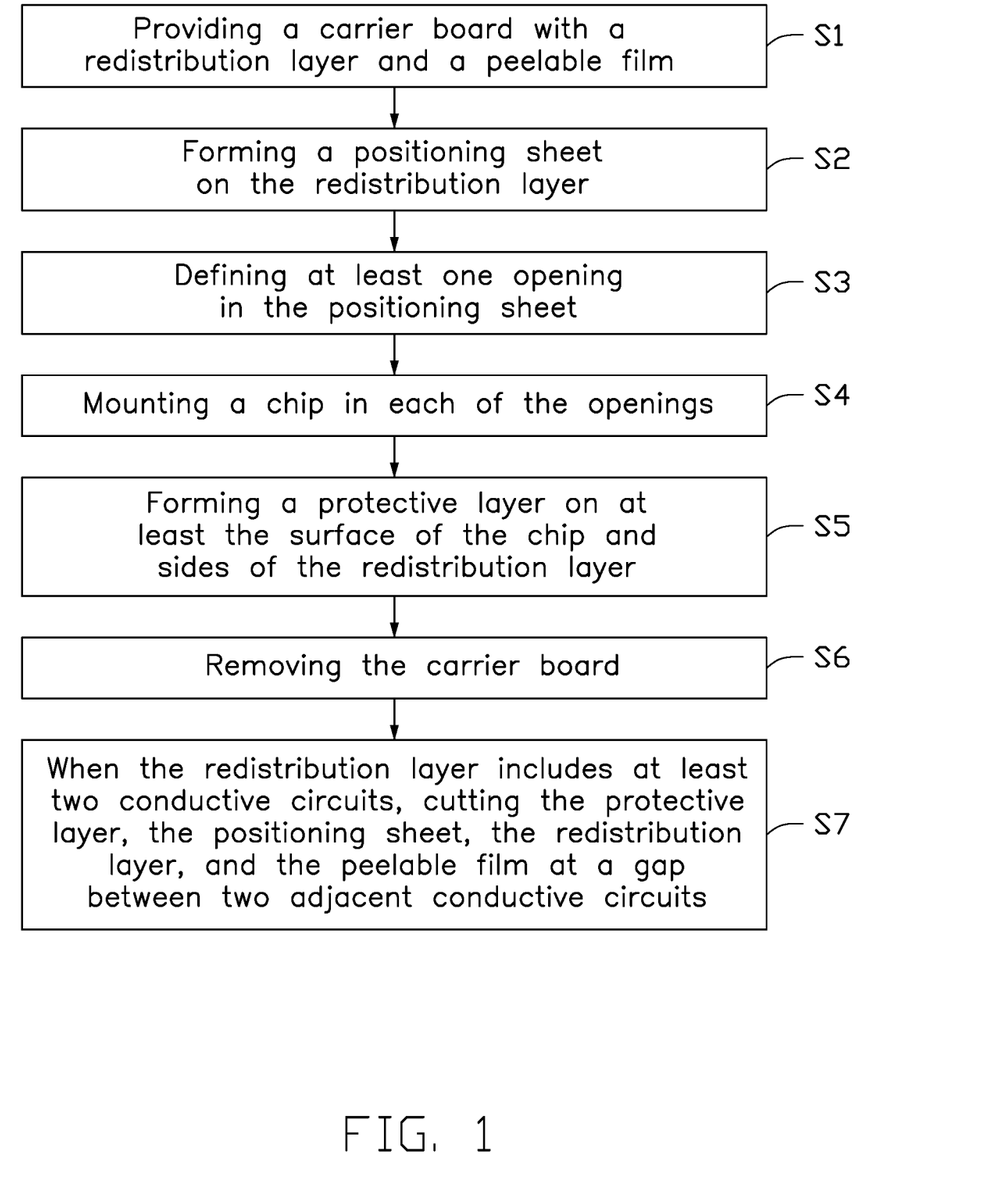
FIG. 1 is a flowchart diagram of a method for making a fan-out packaging structure.

FIG. 1 is a flowchart diagram of a method for making a fan-out packaging structure.

Figure 2:
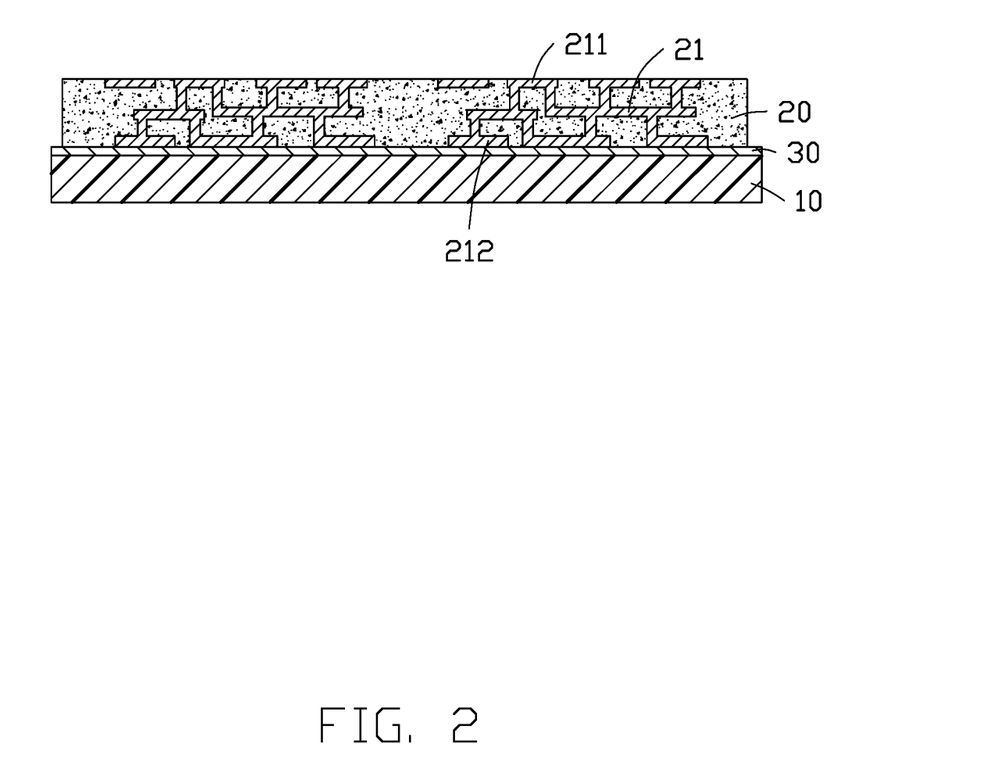
FIG. 2 is a schematic structural diagram of a carrier board and a redistribution layer of a fan-out packaging structure.

At block S1, as shown in FIG. 2, a carrier board 10 is provided.

A redistribution layer 20 is on one surface of the carrier board 10. The redistribution layer 20 is adhered to the carrier board 10 through a peelable film 30. The redistribution layer 20 includes at least one conductive circuit 21. The at least one conductive circuit 21 includes at least one first connection pad 211 located on a surface of the redistribution layer 20 facing away from the peelable film 30, and at least one second connection pad 212 located on a surface of the redistribution layer 20 facing the peelable film 30. The at least one first connection pad 211 is exposed on the surface of the redistribution layer 20 facing away from the peelable film 30, and the at least one second connection pad 212 is exposed on the surface of the redistribution layer 20 facing the peelable film 30.

The at least one first connection pad 211 is electrically connected to the at least one second connection pad 212. The conductive circuit 21 is made of a metal material having high conductivity such as copper, silver, gold, and tungsten. In one embodiment, the conductive circuit 21 is made of metallic copper.

The carrier board 10 may be made of an organic material or an inorganic material, such as glass, polymethyl methacrylate, polyimide, silica gel, and epoxy resin. In one embodiment, the carrier board 10 is made of polyimide.

As shown in FIG. 2, the number of the conductive circuits 21 in the redistribution layer 20 is at least two. Each two adjacent conductive circuits 21 are arranged at intervals.

Figure 3:
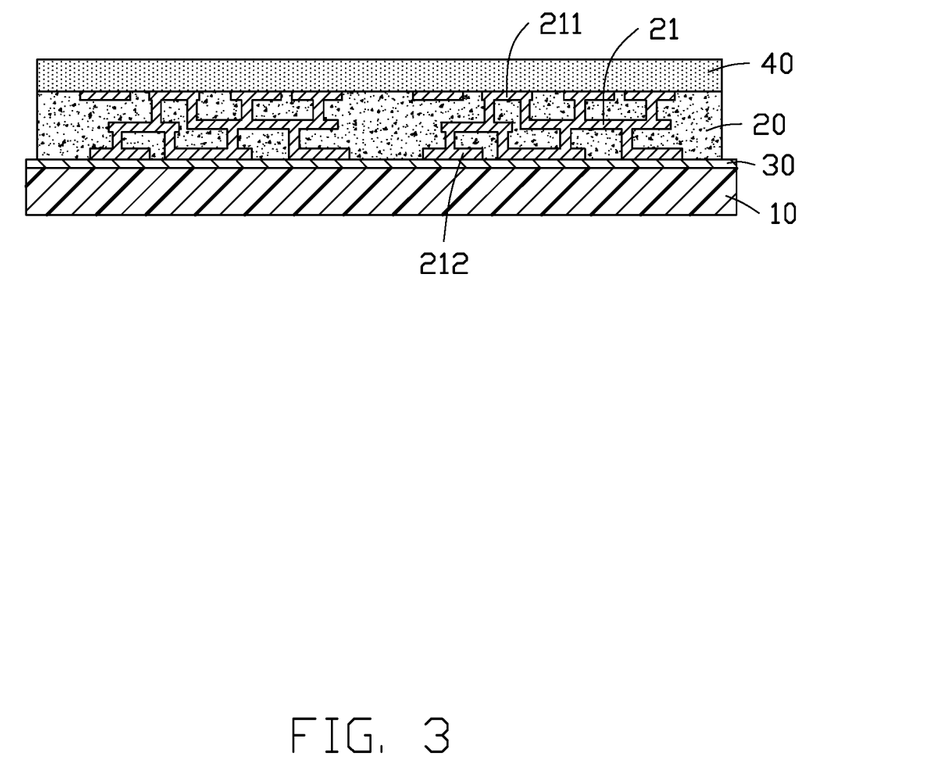
FIG. 3 is a schematic structural diagram of FIG. 2 showing a positioning sheet formed on the redistribution layer.

At block S2, as shown in FIG. 3, a positioning sheet 40 is formed on the redistribution layer 20. In one embodiment, the positioning sheet 40 is made of polyimide.

Figure 4:
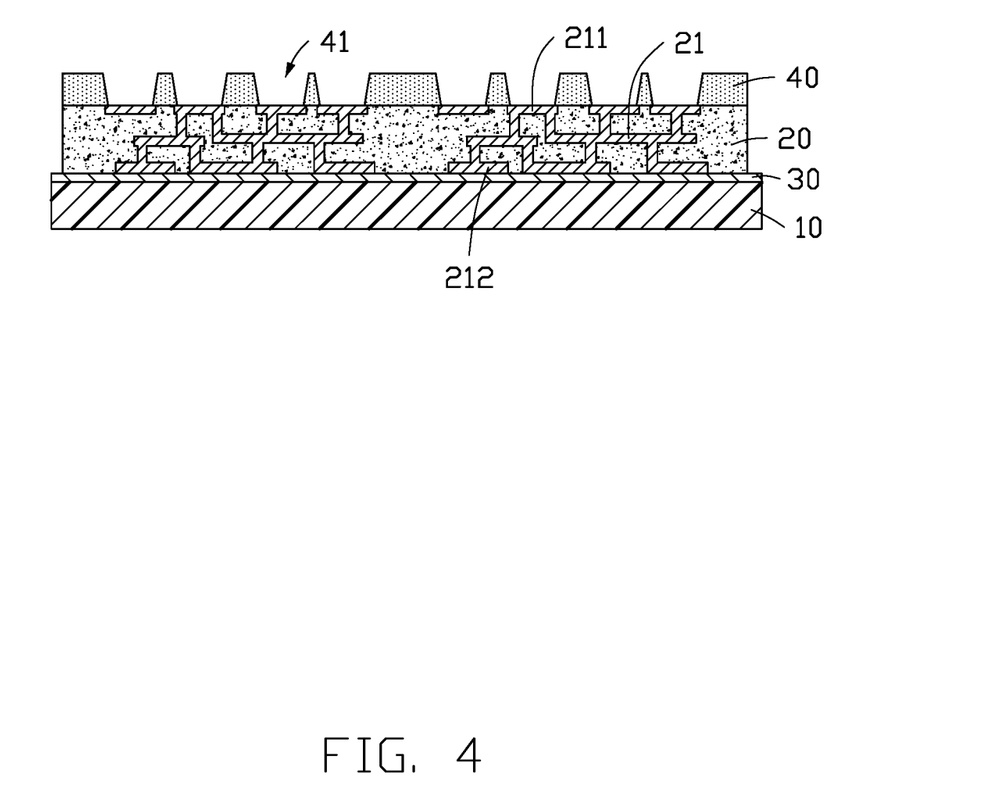
FIG. 4 is a schematic structural diagram of FIG. 3 showing openings defined in the positioning sheet.

At block S3, as shown in FIG. 4, at least one opening 41 is defined in the positioning sheet 40.

The at least one opening 41 penetrates opposite sides of the positioning sheet 40 at a position of the at least one first connection pad 211, so that the at least one first connection pad 211 is exposed through the at least one opening 41. In one embodiment, a diameter of the opening 41 increases from a surface of the positioning sheet 40 facing the redistribution layer 20 to a surface of the positioning sheet 40 facing away from the redistribution layer 20. In one embodiment, the diameter of the opening 41 at the surface of the positioning sheet 40 facing the redistribution layer 20 is equal to a width of the first connection pad 211. A cross-sectional shape of the opening 41 is substantially an inverted regular trapezoid.

In one embodiment, the opening 41 is defined by exposure and development processes. In other embodiments, the opening 41 may be defined by laser punching and mechanical punching processes.

Figure 5:
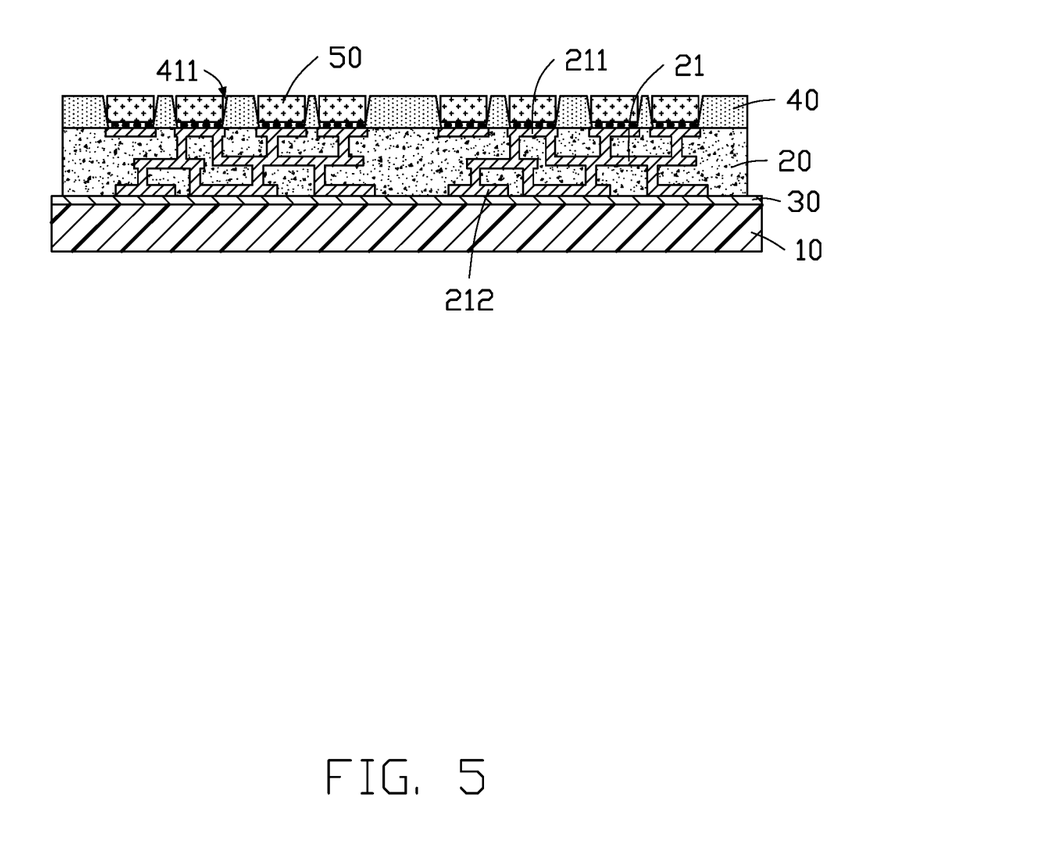
FIG. 5 is a schematic structural diagram of FIG. 4 showing chips mounted in the openings.

At block S4, as shown in FIG. 5, a chip 50 is mounted in the at least one opening 41.

The chip 50 is electrically connected to a corresponding first connection pad 211, and a front surface of the chip 50 faces the corresponding first connection pad 211. In one embodiment, a surface of the chip 50 facing away from the redistribution layer 20 is flush with the surface of the positioning sheet 40 facing away from the redistribution layer 20. Due to the diameter of the opening 41 increasing away from the redistribution layer 20, a gap 411 is defined between the chip 50 and an inner wall of the opening 41. Thus, the chip 50 does not completely fill the opening 41.

Figure 6:
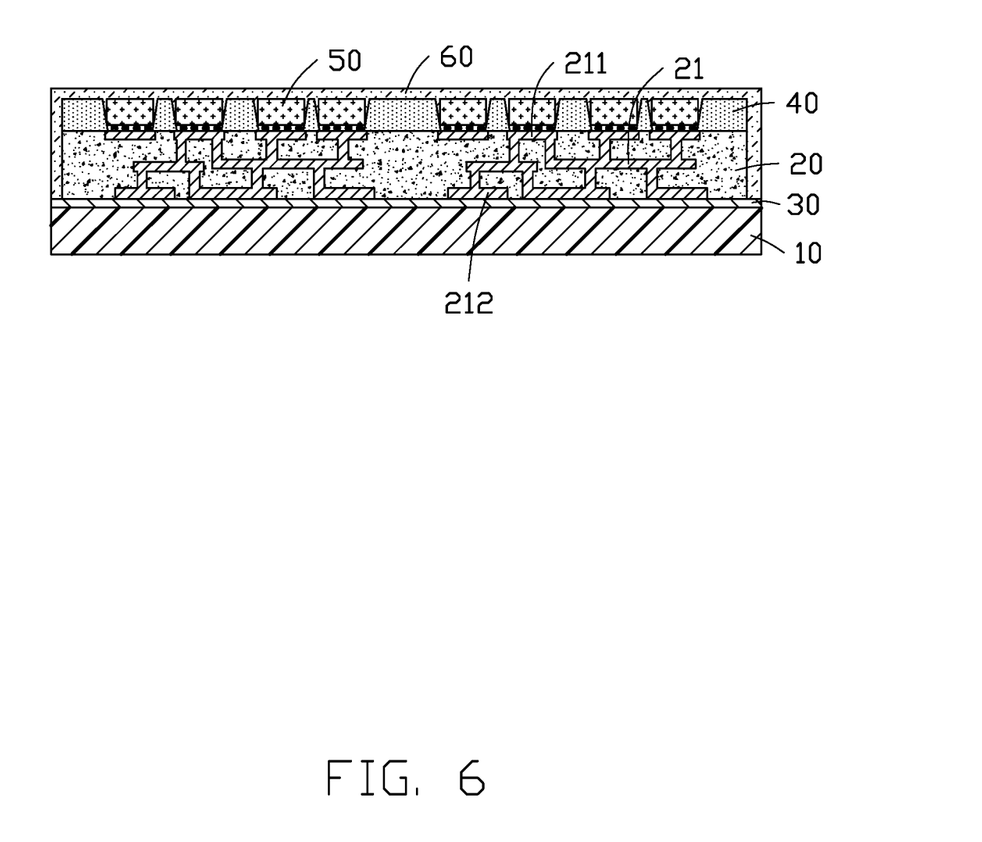
FIG. 6 is a schematic structural diagram of FIG. 5 showing a protective layer formed on the chips and the redistribution layer.

At block S5, as shown in FIG. 6, a protective layer 60 is formed on at least surfaces of the chips 50 facing away from the redistribution layer 20 and on sides of the redistribution layer 20.

The protective layer 60 also covers the surface of the positioning sheet 40 facing away from the redistribution layer 20 and a side surface of the positioning sheet 40. In one embodiment, the protective layer 60 is further filled in the gaps 411. A width of the carrier board 10 may be greater than a width of the redistribution layer 20, so that a portion of a surface of the carrier board 10 is not covered by the redistribution layer 20. The protective layer 60 formed on side surfaces of the redistribution layer 20 covers the portion of the surface of the carrier board 10 that is not covered by the redistribution layer 20.

The protection layer 60 is configured to protect the chips 50, the positioning sheet 40, and the redistribution layer 20. In one embodiment, the protective layer 60 is formed by injection molding. The protective layer 60 may be made of resin, such as polyethylene and polypropylene.

Figure 7:
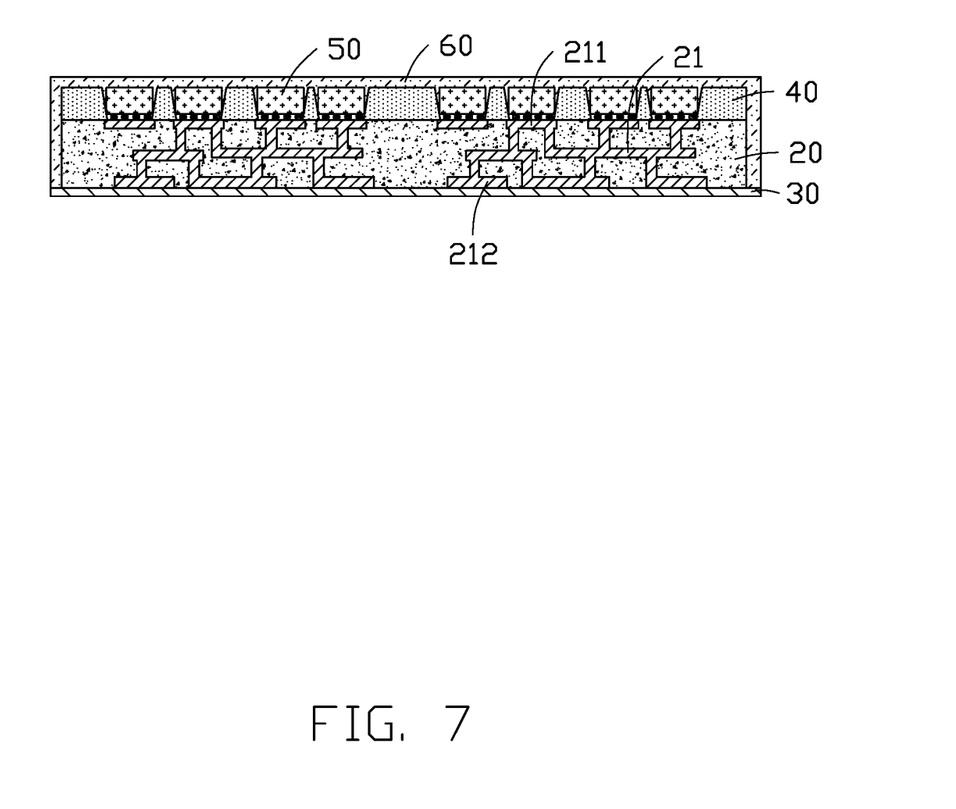
FIG. 7 is a schematic structural diagram of FIG. 6 after the carrier board is removed.

At block S6, as shown in FIG. 7, the carrier board 10 is removed.

Figure 8:
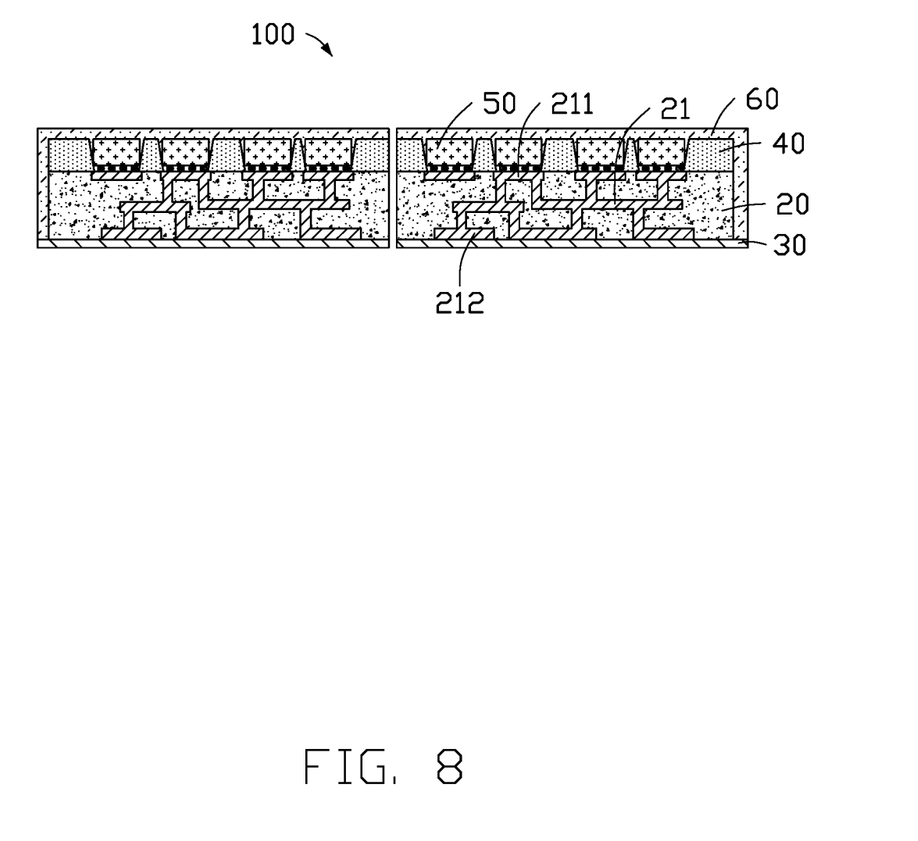
FIG. 8 is a schematic structural diagram of the fan-out packaging structure formed by cutting the structure in FIG. 7.

At block S7, as shown in FIG. 8, when the redistribution layer 20 includes at least two conductive circuits 21, the protective layer 60, the positioning sheet 40, the redistribution layer 20, and the peelable film 30 are cut at a gap between the at least two conductive circuits 21 so as to obtain a fan-out packaging structure 100. In this way, at least two fan-out packaging structures 100 are obtained, and the at least two conductive circuits 21 are not damaged during cutting.

In another embodiment, when only one conductive circuit 21 is provided in the redistribution layer 20, cutting is not required.

The fan-out packaging structure 100 is electrically connected to an external device (not shown) through the at least one second connection pad 212 to implement signal transmission between the fan-out packaging structure 100 and the external device. The peelable film 30 is configured to protect the at least one second connection pad 212 when the at least one second connection pad 212 is not in use. Specifically, to connect the at least one second connection pad 212 to the external device, the peelable film 30 is removed to expose the at least one second connection pad 212. Then, the at least one second connection pad 212 is electrically connected to the external device, thereby realizing signal transmission between the fan-out packaging structure 100 and the external device.

The chips 50 are mounted in the openings 41 of the positioning sheet 40, and the openings 41 hold the chips 50 in position to prevent further processes from shifting a position of the chips 50 and improve an alignment accuracy between the chips 50 and the first connection pads 211. The openings 41 having an inverted trapezoidal cross-sectional shape facilitates the installation of the chips 50, thereby improving a production efficiency of the fan-out packaging structure 100, and different openings 41 can be used for mounting different chips 50, which further improves the production efficiency of the fan-out packaging structure 100.

FIG. 8 shows the fan-out packaging structure 100 formed according to the method in FIG. 1.

The fan-out packaging structure 100 includes the redistribution layer 20, the positioning sheet 40 formed on one surface of the carrier board 10, at least one chip 50, and the protective layer 60.

The redistribution layer 20 includes the at least one conductive circuit 21. The at least one conductive circuits 21 includes the at least one first connection pad 211 located on the surface of the redistribution layer 20 facing the positioning sheet 40, and the at least one second connection pad 212 located on the surface of the redistribution layer 20 facing away from the positioning sheet 40.

The at least one first connection pad 211 is electrically connected to the at least one second connection pad 212. The at least one second connection pad 212 is electrically connected to an external device (not shown) to realize signal transmission between the fan-out packaging structure 100 and the external device. The conductive circuit 21 is made of a metal material having high conductivity such as copper, silver, gold, and tungsten. In one embodiment, the conductive circuit 21 is made of metallic copper.

The peelable film 30 is formed on a surface of the redistribution layer 20 facing away from the at least one chip 50. The peelable film 30 is configured to protect the at least one second connection pad 212. Specifically, to connect the at least one second connection pad 212 to the external device, the peelable film 30 is removed to expose the at least one second connection pad 212. Then, the at least one second connection pad 212 is electrically connected to the external device, thereby realizing signal transmission between the fan-out packaging structure 100 and the external device.

The at least one opening 41 is defined in the positioning sheet 40. The at least one opening 41 penetrates opposite sides of the positioning sheet 40 at a position of the at least one first connection pad 211, so that the at least one first connection pad 211 is exposed through the at least one opening 41. In one embodiment, the diameter of the opening 41 increases from the surface of the positioning sheet 40 facing the redistribution layer 20 to the surface of the positioning sheet 40 facing away from the redistribution layer 20. In one embodiment, the diameter of the opening 41 at the surface of the positioning sheet 40 facing the redistribution layer 20 is equal to the width of the first connection pad 211. The cross-sectional shape of the opening 41 is substantially an inverted regular trapezoid. In one embodiment, the positioning sheet 40 is made of polyimide.

Each chip 50 is electrically connected to the corresponding first connection pad 211, and the front surface of the chip 50 faces the corresponding first connection pad 211. In one embodiment, the surface of the chip 50 facing away from the redistribution layer 20 is flush with the surface of the positioning sheet 40 facing away from the redistribution layer 20. Due to the diameter of the opening 41 increasing away from the redistribution layer 20, the gap 411 is defined between the chip 50 and the inner wall of the opening 41. Thus, the chip 50 does not completely fill the opening 41.

The protective layer 60 covers at least surfaces of the chips 50 facing away from the redistribution layer 20 and on the sides of the redistribution layer 20. In one embodiment, the protective layer 60 also covers the surface of the positioning sheet 40 facing away from the redistribution layer 20 and the side surface of the positioning sheet 40. In one embodiment, the protective layer 60 is further filled in the gaps 411. A width of the peelable film 30 may be greater than the width of the redistribution layer 20, so that the protective layer 60 formed on the side surfaces of the redistribution layer 20 covers a portion of a surface of the peelable film 30 that is not covered by the redistribution layer 20. The protective layer 60 is configured to protect the at least one chip 50, the positioning sheet 40, and the redistribution layer 20. The protective layer 60 may be made of resin, such as polyethylene and polypropylene.

Figure 9:
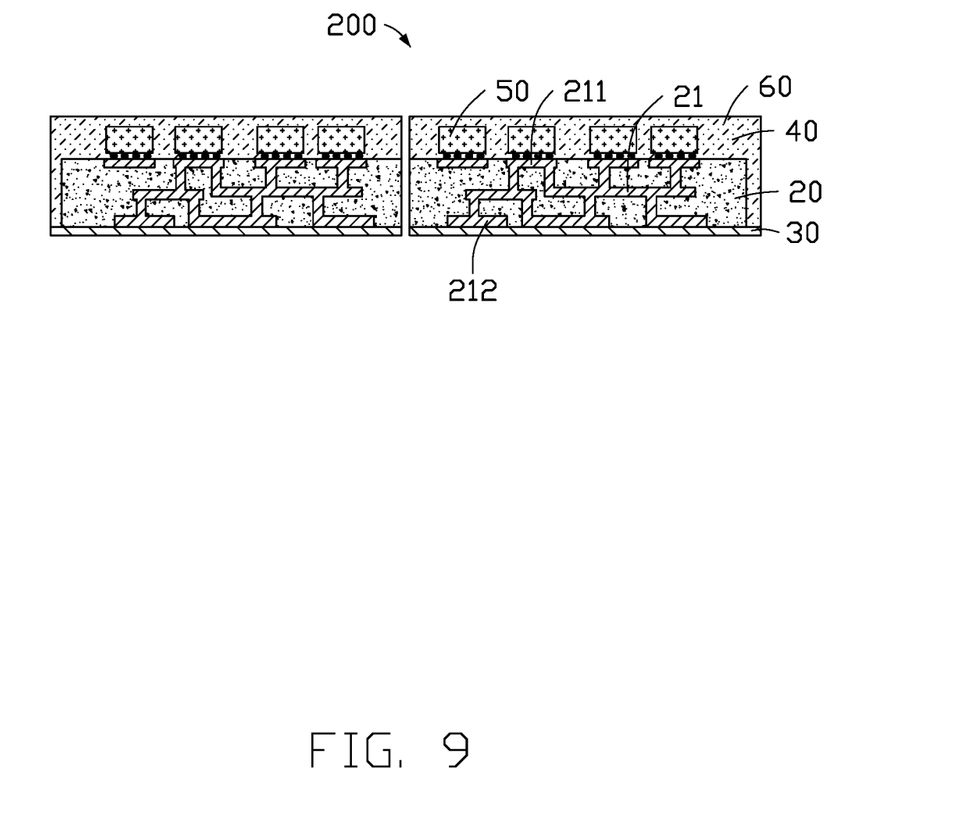
FIG. 9 is a schematic structural diagram of another embodiment of a fan-out packaging structure.

FIG. 9 shows a fan-out packaging structure 200 formed by a second method for forming a fan-out packaging structure. The second method differs from the method in FIG. 1 in that after the chips 50 are formed in the openings 41, the positioning sheet 40 is removed so that the protective layer 60 also covers a surface of the redistribution layer 20 adjacent to the chips 50 and side surfaces of the chips 50. Thus, the fan-out packaging structure 200 formed by the second method does not have the positioning sheet 40.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A method for making a fan-out packaging structure, the method comprising:
   providing a carrier board, wherein a redistribution layer is provided on one surface of the carrier board, and the redistribution layer comprises at least one conductive circuit;
   forming a positioning sheet on the redistribution layer;
   defining at least one opening in the positioning sheet, wherein the at least one opening penetrates through opposite sides of the positioning sheet;
   mounting a chip in each of the at least one opening, wherein the chip is electrically coupled to a corresponding one of the at least one conductive circuit;
   removing the positioning sheet;
   forming a protective layer on surfaces of the chip and on side surfaces of the redistribution layer; and
   removing the carrier board to obtain the fan-out packaging structure.

2. The method of claim 1, wherein:
   each of the conductive circuits comprises at least one first connection pad located on a surface of the redistribution layer facing away from the carrier board;
   the at least one first connection pad is exposed on the surface of the redistribution layer facing away from the carrier board;
   the at least one opening is defined at a position of the at least one first connection pad; and
   the chip is electrically coupled to the at least one first connection pad.

3. The method of claim 2, wherein:
   each of the conductive circuits comprises at least one second connection pad located on a surface of the redistribution layer facing the carrier board; and
   the at least one first connection pad is electrically coupled to the at least one second connection pad.

4. The method of claim 2, wherein:
   a diameter of the opening increases from a surface of the positioning sheet facing the redistribution layer to a surface of the positioning sheet facing away from the redistribution layer;
   the diameter of the opening at the surface of the positioning sheet facing the redistribution layer is equal to a width of the first connection pad;
   a gap is defined between the chip and an inner wall of the opening; and
   the protective layer is filled in the gap.

5. The method of claim 1, wherein:
   the redistribution layer is adhered to the carrier board by a peelable film.

* * * * *